(12) United States Patent
Alexander et al.

(10) Patent No.: US 12,254,382 B2
(45) Date of Patent: Mar. 18, 2025

(54) SYSTEM AND METHODS FOR PRODUCING MAGIC STATES FOR UNIVERSAL QUANTUM COMPUTATION USING GKP ERROR CORRECTION

(71) Applicant: UNM RAINFOREST INNOVATIONS, Albuquerque, NM (US)

(72) Inventors: Rafael Alexander, Albuquerque, NM (US); Nick Menicucci, Melbourne (AU); Ben Baragiola, Melbourne (AU); Giacomo Pantaleoni, Melbourne (AU); Angela Karanjai, Sydney (AU)

(73) Assignee: UNM RAINFOREST INNOVATIONS, Albuquerque, NM (US)

( * ) Notice: Subject to any disclaimer, the term of this patent is extended or adjusted under 35 U.S.C. 154(b) by 279 days.

(21) Appl. No.: 17/426,466

(22) PCT Filed: Feb. 21, 2020

(86) PCT No.: PCT/US2020/019236
§ 371 (c)(1),
(2) Date: Jul. 28, 2021

(87) PCT Pub. No.: WO2020/172538
PCT Pub. Date: Aug. 27, 2020

(65) Prior Publication Data
US 2022/0101173 A1 Mar. 31, 2022

Related U.S. Application Data

(60) Provisional application No. 62/809,195, filed on Feb. 22, 2019.

(51) Int. Cl.
*G06N 10/70* (2022.01)
*G06N 10/00* (2022.01)
*G06N 10/60* (2022.01)

(52) U.S. Cl.
CPC ............ *G06N 10/70* (2022.01); *G06N 10/60* (2022.01)

(58) Field of Classification Search
CPC ........ G06N 10/70; G06N 10/60; G06N 10/00; G06N 10/40; H04L 1/04
See application file for complete search history.

(56) References Cited

U.S. PATENT DOCUMENTS

| 9,978,020 B1 | 5/2018 | Gambetta et al. |
| 2008/0116448 A1 | 5/2008 | Kitaev |
| 2021/0125096 A1* | 4/2021 | Puri ........................ G06N 10/00 |

FOREIGN PATENT DOCUMENTS

WO 2004012139 A2 2/2004

OTHER PUBLICATIONS

Noh, Kyungjoo et al. "Quantum Capacity Bounds of Gaussian Thermal Loss Channels and Achievable Rates With Gottesman-Kitaev-Preskill Codes." IEEE Transactions on Information Theory 65 (2018): 2563-2582. (Year: 2018).*

(Continued)

*Primary Examiner* — Justin R Knapp
(74) *Attorney, Agent, or Firm* — Valauskas Corder LLC (57) ABSTRACT

Applying Gottesman-Kitaev-Preskill (GKP) error correction to Gaussian input states, such as vacuum, produces distillable magic states, achieving universality without additional non-Gaussian elements. Gaussian operations are sufficient for fault-tolerant, universal quantum computing given a supply of GKP-encoded Pauli eigenstates.

13 Claims, 6 Drawing Sheets

(56) References Cited

OTHER PUBLICATIONS

Kyungjoo Noh et al., Fault-tolerant bosonic quantum error correction with the surface-GKP code, Jan. 13, 2020, https://arxiv.org/pdf/1908.03579.*
C. Weedbrook et al., "Gaussian quantum information", Oct. 17, 2011.

* cited by examiner

SYSTEM AND METHODS FOR PRODUCING MAGIC STATES FOR UNIVERSAL QUANTUM COMPUTATION USING GKP ERROR CORRECTION

CROSS-REFERENCE TO RELATED APPLICATIONS

This application is a U.S. National Application of PCT/US2020/019236 filed Feb. 21, 2020, which claims priority to U.S. Provisional Patent Application Ser. No. 62/809,195 filed Feb. 22, 2019.

FEDERALLY SPONSORED RESEARCH OR DEVELOPMENT

This invention was made with government support under PHY1630114 awarded by the National Science Foundation (NSF). The government has certain rights in the invention.

FIELD OF THE INVENTION

The invention relates generally to quantum computing and quantum error correction. More specifically, the invention is a system and method for producing magic states for Gottesman-Kitaev-Preskill (GKP)-qubit-based quantum computing using GKP error correction on a Gaussian input state.

BACKGROUND OF THE INVENTION

The design of most modern day technologies have been influenced by the understanding of quantum mechanics. Building a computer that harnesses the rule of quantum mechanics to process information is slowly becoming more feasible. Because they run on different physics, quantum computers could be used to perform calculations that would take prohibitively long on regular machines.

Quantum computers promise new technology for cyber-security, drug design, material design, and potential to solve (or improve the solution of) a host of other problems. Examples include breaking encryptions based on the hardness of factoring integers (via Shor's algorithm), designing new drugs (via quantum chemistry simulations), and simulating new types of materials, e.g., high temperature superconductors (via many-body quantum simulations).

Quantum computing is the use of quantum-mechanical phenomena such as superposition and entanglement to perform computation. A quantum computer is used to perform such computation. Quantum computers process of information stored and manipulated in logical qubits that are generally embedded in a larger, physical system via an error-correcting code. A qubit or quantum bit is the basic unit of information in a quantum computer. A qubit can store multiple values at once due to the principles of quantum mechanics. In other words, a qubit is a two-state (or two-level) quantum-mechanical system. In a classical system, a bit would have to be in one state or the other. However, quantum mechanics allows the qubit to be in a coherent superposition of both states/levels simultaneously, a property which is fundamental to quantum mechanics and quantum computing.

The promise of a quantum computer lies in its ability to dramatically outpace classical computers for certain tasks. The Threshold Theorem proves that this feature survives even in the presence of (low enough) noise-a property called "fault tolerance", which is based on quantum error correction. There are many proposed error-correcting codes; each is designed to mitigate the effects of noise at the logical level by measuring and correcting noise at the physical level.

Quantum computers are notoriously susceptible to noise which can corrupt calculations in a multitude of ways. Those seeking to build a useful quantum computer need specially designed quantum error correction techniques in order to combat this. Hence, using a quantum error correcting code provides quantum processing circuits with a degree of protection. Though it solves the problem of noise, it also places specific demands on the basic gates used to manipulate the quantum logic. A key ingredient to many fault-tolerant quantum computing architectures are "magic states", which are special quantum states that can be prepared as a substitute for gates that are incompatible with the error-correction hardware.

More specifically, computation using operations restricted to Pauli eigenstate preparation, Clifford transformations, and Pauli measurements—referred to as Clifford quantum computing (QC)-provides all the necessary tools for quantum error correction but cannot outperform classical computation since it is efficiently simulable on a classical computer. Universal quantum computation requires supplementing Clifford QC by a non-Clifford resource such as a preparation, gate or measurement that is not an element of Clifford QC. Often this resource is a non-Pauli eigenstate, referred to as a "magic state". The union of Clifford QC and a supply of magic states is universal for quantum computing and can be made fault tolerant if the physical noise level is low enough.

Fault tolerance requires discrete quantum information. Bosonic codes embed discrete quantum information into continuous-variable (CV) systems in a way that maps general CV noise into effective noise acting on the encoded qubits. Such codes are promising for fault-tolerant computation due to the built-in redundancy afforded by their infinite-dimensional Hilbert space. High precision controllability of optical-cavity and vibrational modes further enhances their appeal.

Using a bosonic code, one may define logical-Clifford QC, comprising encoded Pauli eigenstates and logical Clifford operations, which allows error correction at the encoded-qubit level. This, too, is an efficiently simulable subtheory and thus requires a logical-non-Clifford element for universality.

Gottesman-Kitaev-Preskill (GKP) encoding is an example of bosonic error-correcting code. The GKP encoding distinguishes itself in two ways. The first is its robustness to physical errors. It is designed to correct errors by performing modular position and modular momentum measurements and then executing position and momentum shifts based on the outcomes of these measurements. The GKP encoding has been shown to be the optimal code when the physical error channel is pure loss, which is the dominant noise source in optical cavities and microwave resonators.

Second, the logical Clifford gates associated with the GKP encoding are easy-to-perform; they require only Gaussian operations. Gaussian operations can be physically implemented on an optical mode using phase shifters, beam splitters, squeezers, coherent lasers, and homodyne detectors.

Universal fault-tolerant quantum computing with continuous-variable systems involves many difficult operations. Gaussian (comparatively easy) operations are insufficient, and noise is ubiquitous. The latter means that digitized quantum information is required-a problem solved by the GKP encoding.

Prior proposed methods for implementing a non-Clifford operation all require an additional non-Gaussian resource (in addition to GKP Pauli eigenstates), such as photon counting measurements.

Magic states are required for universal quantum computation in nearly all quantum computing architectures. With previous methods requiring either a second type of non-Gaussian state, a non-Gaussian operation, or a non-Gaussian measurement, what is needed is method that requires just one type of non-Gaussian state. The present invention satisfies this need by producing continuous-variable magic states for fault-tolerant quantum computing using one type of non-Gaussian state to enable fault tolerant universality given Gaussian states, Gaussian operations, and Gaussian measurements.

SUMMARY OF THE INVENTION

Although it has been known that GKP logical-0 states and Gaussian states, operations, and measurements are necessary for fault-tolerant universal quantum computation using the GKP encoding, it was considered insufficient. However, as provided by the invention, GKP logical-0 states and Gaussian states, operations, and measurements are sufficient for fault-tolerant universal quantum computation.

The problem of creating magic states is solved by using GKP logical-0 states to implement GKP quantum error correction to a known harmonic oscillator state, most simply the vacuum state. The invention is a system and method for producing magic states for GKP-qubit-based quantum computing using GKP error correction on a Gaussian input state that requires only Gaussian operations, a single type of GKP Pauli eigenstate (the logical-0 state), and a Gaussian input state (vacuum or low-photon-number thermal state). According to the invention, no non-Gaussian resources beyond GKP Pauli eigenstates are required. Furthermore, no additional external qubits are required. A magic state for logical-Clifford QC (using a particular bosonic code) can be found within Gaussian QC. Thus, the union of these two simulable subtheories is universal and, with low enough physical noise, fault tolerant.

The bosonic code that enables this is the GKP encoding of a qubit into an oscillator. This is the only bosonic code that allows logical-Clifford QC and CV-level error correction to be implemented using Gaussian QC along with a supply of logical-Pauli eigenstates, which are non-Gaussian. Until now, GKP logical-Clifford QC has been elevated to universal quantum computation through non-Gaussian gates (cubic phase gate) or the preparation of a logical magic state (logical Hadamard eigenstate or cubic phase state), all three of which require additional non-Gaussian machinery beyond the logical-Pauli eigenstate.

A quantum harmonic oscillator can be used for quantum computing by encoding into it a logical qubit using a bosonic quantum-error-correcting codes (bosonic codes for short). Noise that affects the harmonic oscillator at the physical level can be detected and corrected such that the quantum information in the encoded logical qubit is preserved. There are several proposed bosonic error-correcting codes. A bosonic error-correcting code can be implemented in any quantum harmonic oscillator including (a) the motional state of a trapped atom or ion and (b) an electromagnetic mode such as an optical cavity, free-space optical mode, or microwave resonator.

The invention is applicable to continuous-variable quantum computing, optical quantum computing, and quantum computing with circuit QED (superconducting devices).

More specifically, it is contemplated that the invention is applicable to technologies such as linear optics, squeezers, homodyne measurements, and lasers.

Advantageously, the invention does not rely on additional non-Gaussian measurements (like external phase estimation). It requires only assumed-to-exist technology to make GKP magic states.

Another advantage of the invention is that the input state does not have to be a pure state. Some tolerance for thermal noise is desirable. Given a pure state, a distillable state is almost always produced—with the set of non-distillable states being vanishingly small. When the input state is thermal, the set of non-distillable states increases but distillability remains if the average photon number is low enough.

It is contemplated that the invention is easily extendable to produce other non-Pauli eigenstates, which could be preferable in certain circumstances. The invention be used with any GKP lattice and generally any high-purity input state, including squeezed states. The invention can produce magic states for the GKP encoding when the GKP Pauli eigenstates used in the procedure themselves have embedded finite-squeezing error. Furthermore, the invention can be used to produce magic states for other bosonic codes. That is, at the circuit level the same "error correction" procedure applied to vacuum probabilistically produces a magic state, although the required operations may not be Gaussian, i.e., the Controlled-Z gate may not be Gaussian and the measurement may not be Gaussian.

With quantum computers notoriously susceptible to noise, which can corrupt calculations in a multitude of ways, specially designed quantum error correction techniques are needed. A quantum error correcting code can be used, which provides quantum processing circuits with a degree of protection. Though it solves the problem of noise, it also places specific demands on the basic gates used to manipulate the quantum logic. A key ingredient to many fault-tolerant quantum computing architectures are magic states, which are special quantum states that can be prepared as a substitute for gates that are incompatible with the error-correction hardware.

The invention is directed to a simple and convenient way of preparing magic states that are suitable for a type of quantum error correcting code made from a quantum harmonic oscillator.

These and other exemplary features and advantages of the present invention will become clear from the following description with reference to the accompanying drawings.

BRIEF DESCRIPTION OF THE DRAWINGS

The following drawings form part of the specification and are included to further demonstrate certain embodiments or various aspects of the invention. In some instances, embodiments of the invention can be best understood by referring to the accompanying drawings in combination with the presented detailed description. The description and accompanying drawings may highlight a certain specific example, or a certain aspect of the invention. However, one skilled in the art will understand that portions of the example or aspect may be used in combination with other examples or aspects of the invention.

DETAILED DESCRIPTION OF THE INVENTION

According to the invention, a magic state for logical-Clifford QC (using a particular bosonic code) can be found within Gaussian QC. GKP-Clifford QC and Gaussian QC combine with no additional non-Gaussian resources into fault-tolerant, universal QC. This is straightforward for qubits—combining Clifford QC based on different Pauli frames can be achieved since stabilizer states of one are magic states for the other.

The following shows how to produce a distillable GKP magic state using GKP error correction on a thermal state (vacuum or finite temperature), along with a complete analysis of the success probability of preparing a high-quality magic state from any given thermal state. The invention is applicable to both square- and hexagonal-lattice GKP encodings.

Notation and conventions used throughout the specification are now defined. Position is defined as $$\hat{p} := \frac{-i}{\sqrt{2}}(\hat{a} - \hat{a}^\dagger)$$

and momentum is defined as $$\hat{q} := \frac{-i}{\sqrt{2}}(\hat{a} - \hat{a}^\dagger)$$

for any mode $\hat{a}$. This means $[\hat{q}; \hat{p}]=i$, with a vacuum variance of ½ in each quadrature and $\hbar=1$.

The Weyl-Heisenberg displacement operators $\hat{X}(s):=e^{-is\hat{p}}$ and $\hat{Z}(s):=e^{is\hat{q}}$ displace a state by $+s$ in position and momentum, respectively. For brevity, joint displacement is defined as $\hat{V}(s):=\hat{Z}(s_p)\hat{X}(s_q)$, where $s=(s_q, s_p)^T$.

The functions $\psi(s):=_q\langle s, \psi\rangle$ and $\tilde{\psi}(s):=_p\langle s, \psi\rangle$ denote position-space and momentum-space wave function for a state $|\psi\rangle$, respectively (tilde indicates momentum space. Any function, including wave functions, can be evaluated with respect to position, $\varphi(\hat{q}):=\int ds\, \varphi(s)|s\rangle_{qq}\langle s|$, to – produce an operator diagonal in the position basis|– and similarly for momentum. Finally, Dirac comb with spacing $\Delta$ is defined as $III_\Delta(x):=\Sigma_{n\in\mathbb{Z}}\delta(x-n\Delta)$ as a Dirac comb with spacing $\Delta$.

The original square-lattice GKP encoding formulation is described in D. Gottesman, A. Kitaev, and J. Preskill, *Encoding a Qubit in an Oscillator*, Phys. Rev. A 64, 012310 (2001), otherwise referred to as "original formulation". In this original formulation, the wave functions for the logical basis states $\{|0_L\rangle, |1_L\rangle\}$ are Dirac combs in position space with state-dependent offset: $\psi_{j,L}(s)=III_{2\sqrt{\pi}}(s-j\sqrt{\pi})$ for $j\in\{0, 1\}$. Their momentum-space wave functions are also Dirac combs but with no offset, different spacing, and a relative phase between the spikes:

$$\tilde{\psi}_{J,L}(s) = \frac{1}{\sqrt{2}}(-1)^{\frac{js}{\sqrt{\pi}}} III_{\sqrt{\pi}}(s).$$

Note that the momentum-space spikes for $|1_L\rangle$ alternate sign, and those for $|0_L\rangle$ are uniform.

GKP logical operators $\hat{X}_L$ and $\hat{Z}_L$ are implemented by displacements $\hat{X}(\sqrt{\pi})$ and $\hat{Z}(\sqrt{\pi})$, respectively, while displacements by integer multiples of $2\sqrt{\pi}$ in either quadrature leave the GKP logical subspace invariant. For later use, the four GKP-encoded logical Pauli is defined as:

$$\bar{\rho}_L^\mu := \Sigma_{jk}\sigma_{jk}^\mu|j_L\rangle\langle k_L| \quad \text{Equation (1)}$$

where $\sigma_{jk}^\mu$ is the jk'th element of Pauli matrix $\sigma^\mu$ (with $\sigma^0=I$). Note that $\bar{\sigma}_L^\mu$ have support only on the GKP logical subspace, while $\hat{X}_L$ and $\hat{Z}_L$ have full support. Finally, the (rank-two) projector is denoted onto the GKP logical subspace:

$$\hat{\Pi}_{GKP}:=\bar{\sigma}_L^0=\tilde{\psi}_{0,L}(\hat{q})\psi_{0,L}(\hat{p})=\tilde{\psi}_{0,L}(\hat{p})\tilde{\psi}_{0,L}(\hat{q}) \quad \text{Equation (2)}$$

Kraus operator for GKP error correction is now discussed. In its original formulation, GKP error correction is a quantum operation that corrects an encoded qubit that has acquired some noise (leakage of its wave function outside of the logical subspace) by projecting it back into the GKP logical subspace, possibly at the expense of an unintended logical operation. A standard implementation of error correction strives to avoid these unintended logical operations (residual errors).

In what follows, the machinery of error correction is applied to a known Gaussian state, which means the outcome-dependent final state is known perfectly. Since the input state is known (which is usually not true of quantum error correction), exactly what state results from the procedure are known.

Figure 1A:
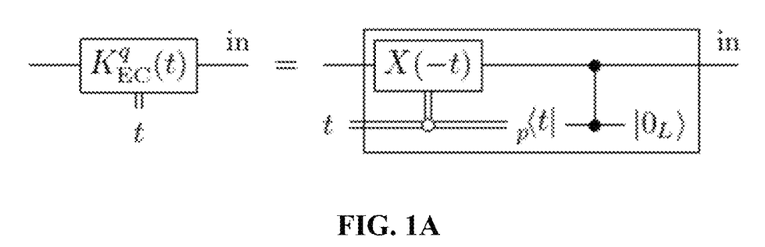
FIG. 1A illustrates a circuit used for correction according to an embodiment of the invention.

GKP error correction proceeds in two steps: First, the one quadrature is corrected, then the conjugate quadrature. The Kraus operator is now defined that corrects just the q quadrature $\hat{K}_{EC}^q(t)$ via the circuit (read right to left) as shown in FIG. 1A where the controlled operation is $\hat{C}_Z=e^{i\hat{q}\otimes\hat{q}}$, and $t\in\mathbb{R}$ is the measurement outcome. This circuit differs from the original formulation in that the correction here is a negative displacement by $t$ rather than by $t$ rounded to the nearest integer multiple of $\sqrt{\pi}$. The outputs may differ by a logical operation $\hat{X}(\pm\sqrt{\pi})$, but this difference is unimportant because the input state is known.

Direct evaluation shows $\hat{K}_{EC}^q(t)=\tilde{\psi}_{0,L}(\hat{q})\hat{X}(-t)$. A similar calculation shows that the Kraus operator for correcting the p quadrature is $\hat{K}_{EC}^p(t)=\tilde{\psi}_{0,L}(\hat{p})\hat{Z}(-t)$. Applying both corrections (in either order since they commute up to a phase) performs full GKP error correction:

$$\hat{K}_{EC}(t)=\hat{K}_{EC}^p(t_p)\hat{K}_{EC}^q(t_q)=\hat{\Pi}_{GKP}\hat{V}(-t) \quad \text{Equation (3)}$$

with measurement outcomes $t=(t_q, t_p)^T$. This Kraus operator (i) displaces the state by an outcome-dependent amount $\hat{V}(-t)$, and then (ii) projects it back into the GKP logical subspace with $\hat{\Pi}_{GKP}$.

Applying $\hat{K}_{EC}(t)$ to an input state $\hat{\rho}_{in}$ produces the unnormalized state $\bar{\rho}(t) = \hat{K}_{EC}(t)\hat{\rho}_{in}\hat{K}_{EC}^\dagger(t)$, where the bar indicates lack of normalization. The joint probability density function (pdf) for the outcomes, $pdf(t) = Tr[\bar{\rho}(t)]$, normalizes the output state: $\hat{\rho}(t) = \bar{\rho}(t)/pdf(t)$.

Now, Bloch vector for the error-corrected state is discussed. Using the logical basis in Equation (1) the output state $\hat{\rho}(t) = \frac{1}{2} \sum_\mu r_\mu(t)\hat{\sigma}_L^\mu$ is represented by a 4-component Bloch vector $r(t)$ with outcome-dependent coefficients $r_\mu(t) := Tr[\hat{\rho}(t)\hat{\sigma}_L^\mu]$. For the unnormalized state, $\bar{r}_0(t) = pdf(t)$ and for the normalized state, $r_0(t) = 1$. In what follows, the notation $r = (r_0, \vec{r})$, where $\vec{r}$ is the ordinary (3-component) Bloch vector within r.

Figure 1B:
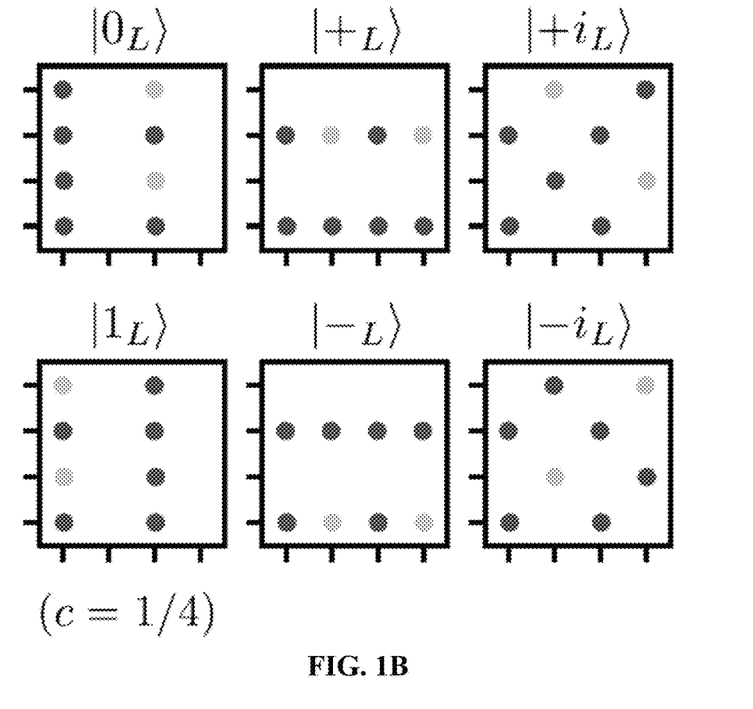
FIG. 1B illustrates a block diagram of Wigner-function representation of the square-lattice GKP Pauli eigenstates according to an embodiment of the invention.
Figure 1C:
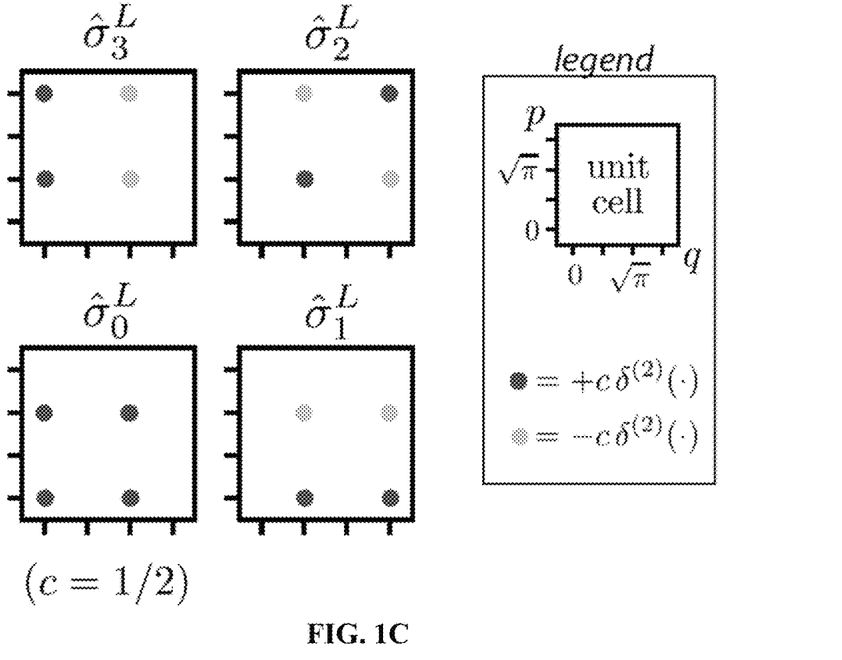
FIG. 1C illustrates a block diagram of Wigner-function representation of the square-lattice GKP logical Pauli operators in a single unit cell of phase space according to an embodiment of the invention.

Wigner functions are employed for the logical basis states of the original formulation as shown in FIG. 1B, to find the Wigner functions for the GKP-encoded Pauli operators and the GKP logical identity, Equation (1). Their explicit form is $$W_{\sigma_L^\mu}(x) = \sum_{n \in \mathbb{Z}^2} \frac{(-1)^{n^T \ell_\mu}}{2} \delta^{(2)}\left[x - \left(n + \frac{\ell_\mu}{2}\right)\sqrt{\pi}\right] \quad \text{Equation (4)}$$

where $x = (q, p)^T$, $l_0(0,0)^T$, $l_1(1,0)^T$, $l_2(1,1)^T$, $l_3(0,1)^T$, and $\bar{l}_\mu$ is $l_\mu$ with its entries swapped. FIG. 1C illustrates a block diagram of Wigner-function representation of the square-lattice GKP logical Pauli operators in a single unit cell of phase space with dimensions $(2\sqrt{\pi}) \times (2\sqrt{\pi})$. The states are normalized to 1 over one unit cell which determines the coefficients c.

Since $\hat{\Pi}_{GKP}\hat{\sigma}_L^\mu\hat{\Pi}_{GKP} = \hat{\sigma}_L^\mu$ the projection using $\hat{\Pi}_{GKP}$ is skipped and the unnormalized Bloch vector components are directly calculated from the overlap of the unnormalized error-corrected state $\bar{\rho}(t)$ with the logical Paulis. The overlaps in the Wigner representation are found:

$$\bar{r}_\mu(t) = Tr[\bar{\rho}(t)\hat{\sigma}_L^\mu] = Tr[\hat{V}(-t)\hat{\rho}_{in}\hat{V}^\dagger(-t)\hat{\sigma}_\mu] = 2\pi \iint d^2x \times$$
$$W_{in}(x+t)W_{\sigma_L^\mu}(x) \quad \text{Equation (5)}$$

where $W_{in}(x)$ is the Wigner function of the input state $\hat{\rho}_{in}$. Note that $\bar{r}_0(t) = Tr[\bar{\rho}(t)] = pdf(t)$, which is normalized over a unit cell of size $(2\sqrt{\pi}) \times (2\sqrt{\pi})$ (since the full pdf is periodic). The normalized Bloch 4-vector is $r(t) := \bar{r}(t)/\bar{r}_0(t)$.

In what follows, GKP error correction is applied to a general Gaussian state, i.e., an input state whose Wigner function is $W_{in}(x) = G_{x_0, \Sigma(x)}$, where $G_{x_0, \Sigma(x)}$ is a normalized Gaussian with mean vector $x_0$ and covariance matrix $\Sigma$.

Equation (5) can be evaluated analytically when the input state is Gaussian:

$$\bar{r}_\mu(t) = \frac{1}{4\pi}\left[G_{0,(4\pi\Sigma)^{-1}}(v)\right]^{-1}\Theta\left(v + \frac{\bar{\ell}_\mu}{2}, \tau\right) \quad \text{Equation (6)}$$

where $$\tau = \frac{1}{2}\Sigma^{-1}, \quad v = \tau\left[\frac{1}{2}\ell_\mu - \frac{1}{\sqrt{\pi}}(x_o + t)\right],$$

and the Riemann (a.k.a. Siegel) theta function is defined as $\Theta(z, \tau) := \sum_{m \in \mathbb{Z}^n} \exp[2\pi i(\frac{1}{2}m^T\tau m + m^T z]$ for $\tau \in \mathbb{H}_n$. The set $\mathbb{H}_n$ denotes the Siegel upper half space, i.e., the set of all complex, symmetric, $n \times n$ matrices with positive definite imaginary part. The overall coefficient $$\frac{1}{4\pi}$$

ensures that pdf(t) is normalized over a single unit cell.

GKP magic states from error correction is now discussed. GKP error correction of a Gaussian state yields a known, random state encoded in the GKP logical subspace. Unless that state is highly mixed or too close to a logical Pauli eigenstate, it can be used as a (noisy) magic state to elevate GKP Clifford QC to fault-tolerant universal QC. It has been suggested to couple a vacuum mode to an external qubit to perform GKP error correction and then post-select an outcome close to $t \approx 0$ to produce a logical H-type state. In fact, neither post-selection nor interaction with a material qubit is required.

Figure 2:
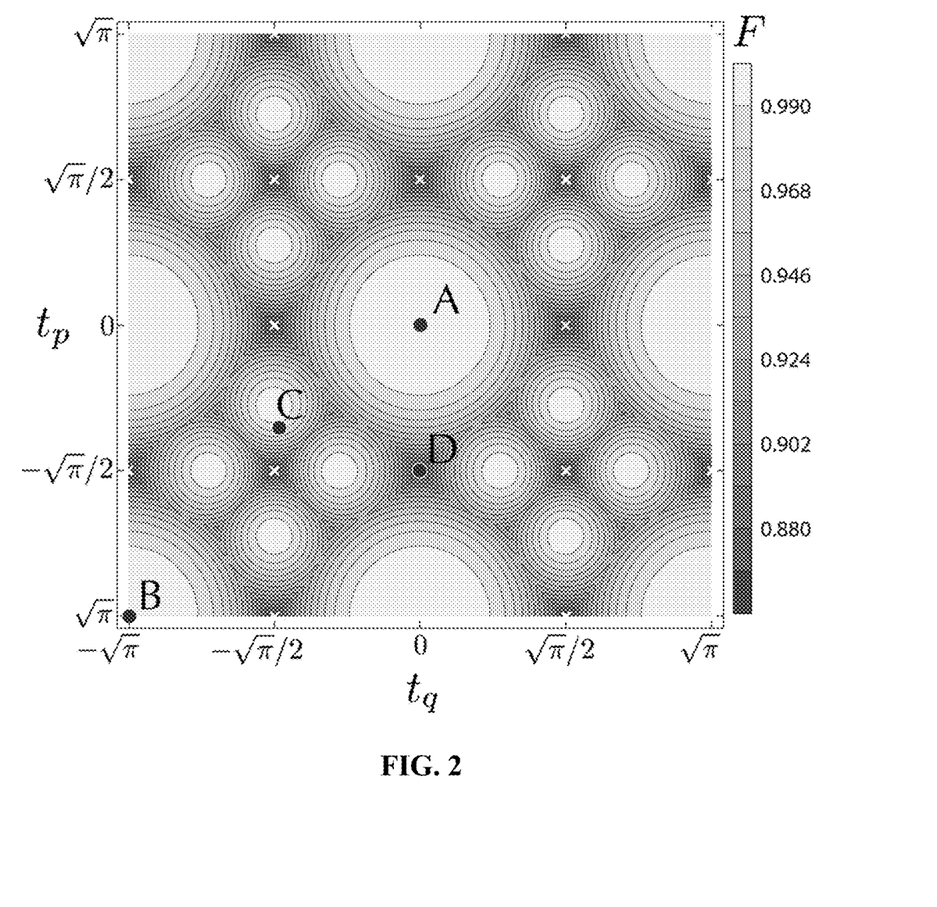
FIG. 2 illustrates a graph of GKP error correction of a vacuum according to an embodiment of the invention.
Figure 3:
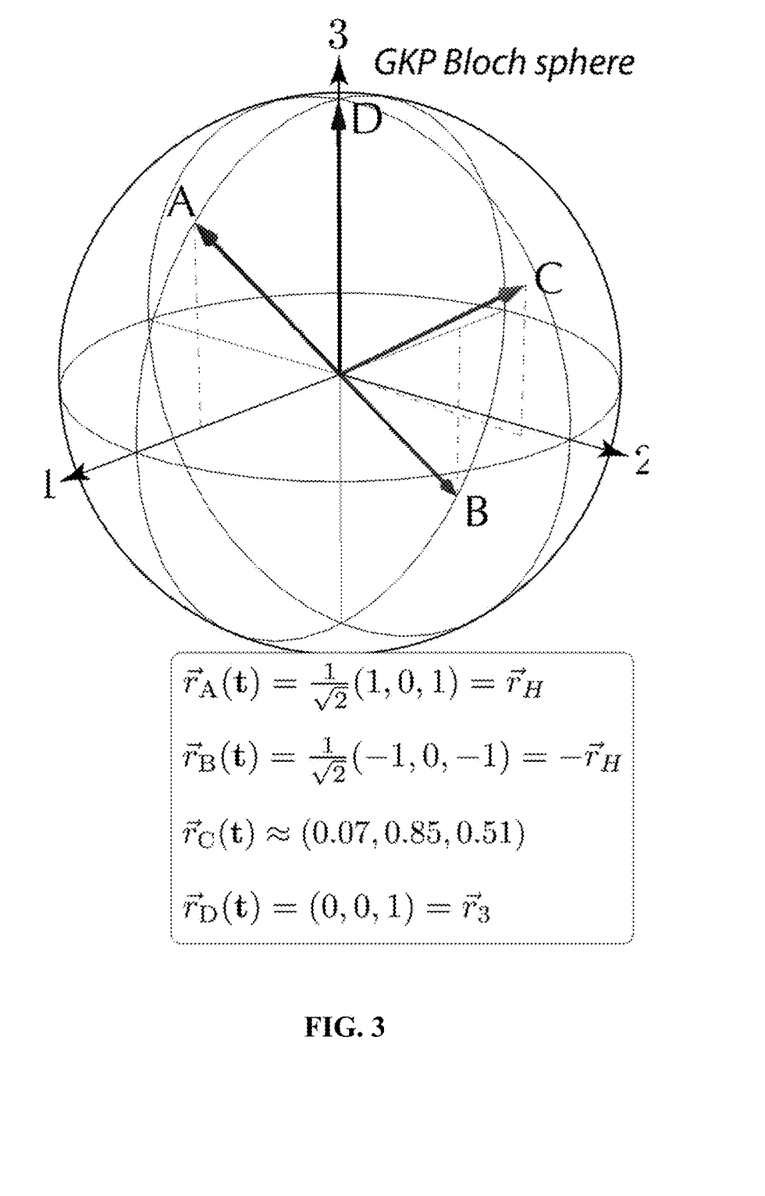
FIG. 3 illustrates a GKP Bloch sphere diagram of representative conditional Bloch vectors for outcomes A-D shown in FIG. 2 according to an embodiment of the invention.

With access to a supply of $|0_L\rangle$ states, there is no need for any other resources except Gaussian QC, and nearly any outcome t from applying GKP error correction to the vacuum state produces a distillable H-type magic state as shown in FIG. 2. This is because there are 12 H-type magic states (all related by Cliffords to $|+H_L\rangle$), and any of them will do the job. The relevant quantity is the fidelity F to the closest H-type state. Without loss of generality, assume this is $|+H_L\rangle$, whose Bloch 3-vector is $\vec{r}_H = \frac{1}{\sqrt{2}}(1, 0, 1)$. If not, GKP Cliffords may be applied until it is. Then, $F = \langle +H_L|\hat{\rho}(t)|+H_L\rangle = \frac{1}{2}[1 + \vec{r}_H \cdot \vec{r}(t)]$. As shown in FIG. 2, the only outcomes that do not yield a distillable magic state are marked with a white "x" (these yield GKP Pauli eigenstates). Representative conditional Bloch vectors for outcomes (A-D) are shown on the GKP Bloch sphere in FIG. 3.

Figure 4:
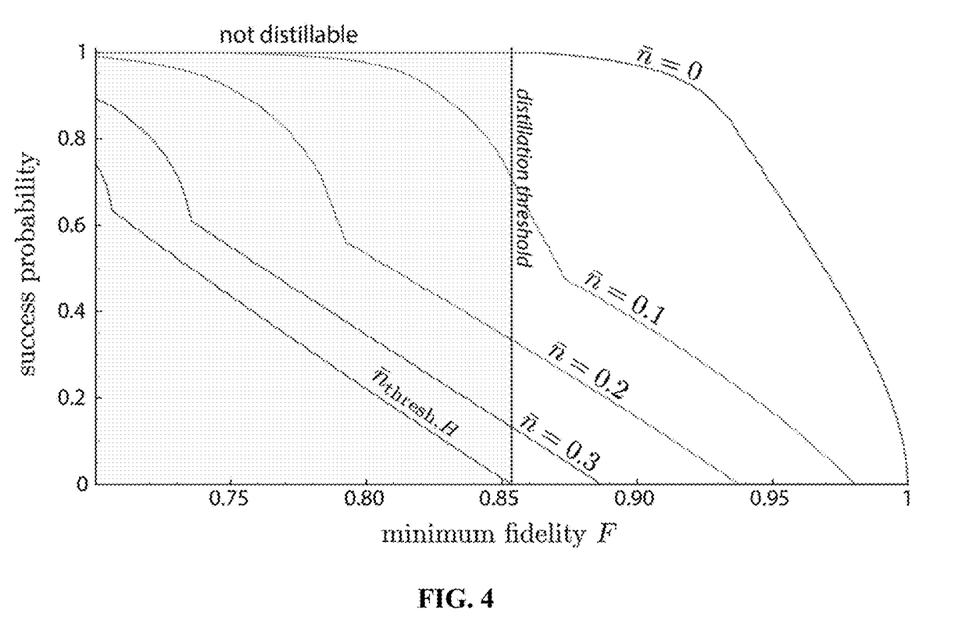
FIG. 4 illustrates a plot diagram of the probability of producing an H-type resource state according to an embodiment of the invention.

Purity is not required either. Applying GKP error correction to a thermal state also succeeds with nonzero probability, and distillation is possible, so as long as $\bar{n} < \bar{n}_{thresh,H} = 0.366$. FIG. 4 illustrates the probability of producing an H-type resource state of at least fidelity F by performing GKP error correction on a thermal state of mean occupation $\bar{n}$. Resource states with fidelity higher than the distillation threshold (F >0.853) can be distilled into higher-quality $|+H_L\rangle$ states. A thermal state is Gaussian with $x_0 = 0$ and $\Sigma = (\bar{n} + \frac{1}{2})I$, which is plugged into Equation (6) to produce the plot of FIG. 4. Since thermal states are biased towards magic states in the xz-plane of the Bloch sphere shown in FIG. 3, maximum fidelity with those magic states in the xy- and yz-plane drops below the distillation threshold first as $\bar{n}$ increases, leading to the kinks in FIG. 4.

Most high-purity, Gaussian states can be GKP-error corrected into a distillable magic state because most states do not preferentially error correct to a Pauli eigenstate. For the vacuum, pdf(t) is always between 0.066 and 0.094, i.e., all outcomes, and thus a wide variety of states, are roughly equally likely.

The results can be extended to the hexagonal-lattice GKP code by simply modifying the Gaussian state to be error corrected as follows. With $\hat{U}$ defined as the Gaussian unitary such that $\hat{U}|\hat{\psi}_L^{square}\rangle = |\hat{\psi}_L^{hex}\rangle$, where the logical state is the same although the encoding differs. Let $\hat{\rho}$ be a Gaussian state to be GKP error corrected using the hexagonal lattice, with $x_0 = 0$ and covariance $\Sigma$. Then, the equivalent state to be GKP error corrected using the square lattice is $\hat{\rho}_{in}' = \hat{U}^\dagger\hat{\rho}_{in}\hat{U}$, which is Gaussian with $x_0 = 0$ and covariance $\Sigma' = S^{-1}\Sigma S^{-T}$, where $$S = (2\sqrt{3})^{-\frac{1}{2}} \begin{pmatrix} 2 & -1 \\ 0 & \sqrt{3} \end{pmatrix}.$$

Figure 5:
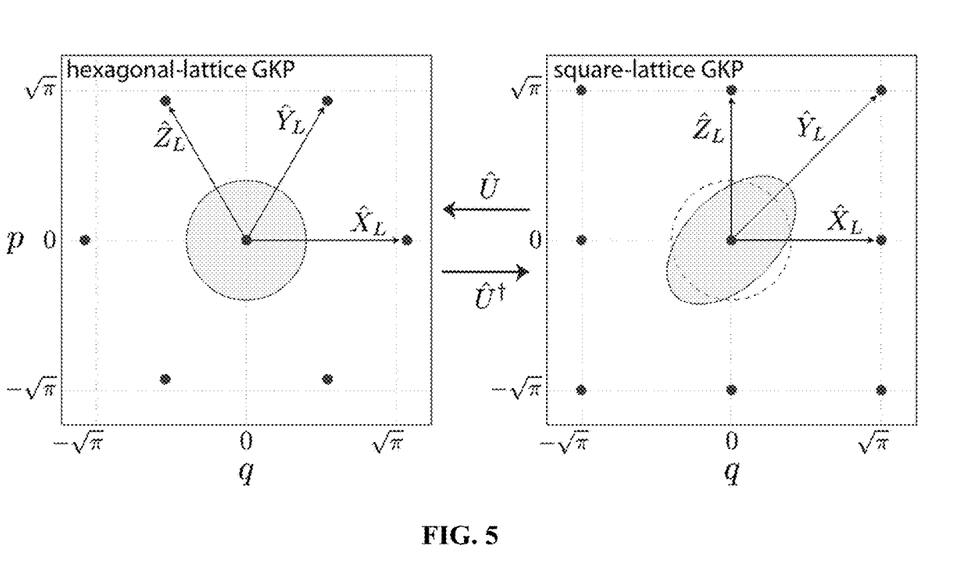
FIG. 5 illustrates a graph of square-lattice GKP logical states mapped to equivalent hexagonal-lattice GKP logical states according to an embodiment of the invention.

This mapping is shown for $\hat{\rho}_{in}=|vac\rangle\langle vac|$ in FIG. 5. More specifically, FIG. 5 illustrates a graph of square-lattice GKP logical states mapped to equivalent hexagonal-lattice GKP logical states according to an embodiment of the invention. A vacuum state on the hexagonal lattice (1–σ error ellipse) is mapped to a squeezed state on the square lattice under $\hat{U}^\dagger$.

Figure 6:
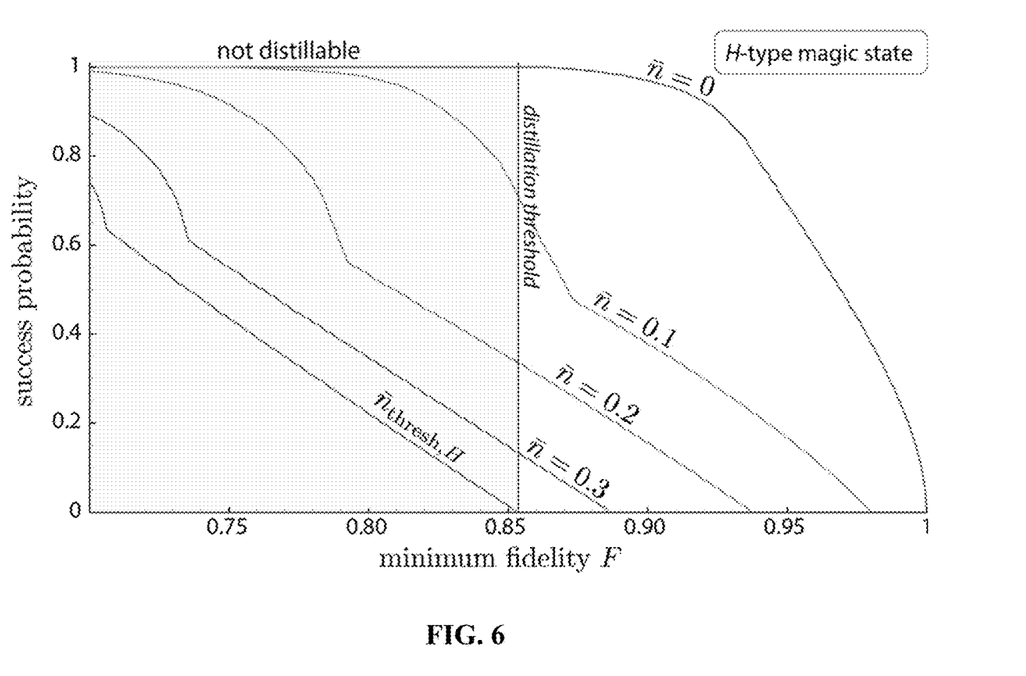
FIG. 6 illustrates a plot diagram of the probability of producing a distillable resource according to an embodiment of the invention.

Using this mapping, results for hexagonal-lattice GKP error correction can be found by reusing Equation (6) with the modified state. Vacuum and thermal states are biased towards the xz-plane of the Bloch sphere in the square-lattice encoding but unbiased with respect to all three Pauli axes in the hexagonal-lattice encoding. Thus, in FIG. 6, the fidelity of hexagonal-lattice GKP error correction of a thermal state of mean occupation $\bar{n}$ is plotted against T-type magic states such as $|+T_L^{hex}\rangle$, which has Bloch 3-vector $$\vec{r}_T = \frac{1}{\sqrt{3}}(1, 1, 1).$$

Resource states whose Bloch vectors lie on or within the stabilizer octahedron (F≤0.789) cannot be distilled, which occurs at $\bar{n}_{bound,T}=0.468$. For T states, a tight distillation threshold has been proven for F >0.8273 [28], which occurs for $\bar{n}_{thresh,T}=0.391$.

These results can be generalized straightforwardly to the case of imperfect $|0_L\rangle$ states represented approximately as $\hat{K}_\beta|0_L\rangle$ where $\hat{K}_\beta:=e^{-\beta\hat{a}^\dagger\hat{a}}$ for some β<<1 (and ignoring normalization).

The approximate GKP Pauli are $\hat{K}_\beta\hat{\sigma}_L^\mu\hat{K}_\beta$. Noting that $Tr(\hat{\rho}\hat{K}_\beta\hat{\sigma}_L^\mu\hat{K}_\beta)=Tr(\hat{K}_\beta\hat{\rho}\hat{K}_\beta\hat{\sigma}_L^\mu)$ so the (Gaussian) imperfections represented by $\hat{K}_\beta$ can be accounted for by applying them to the input state instead. Since the fidelity requirements for magic-state distillation are orders of magnitude less than those for fault-tolerant Clifford QC, any residual noise introduced by $\hat{K}_\beta$ will not qualitatively change the main result.

An alternate embodiment of the invention is to perform error correction as heterodyne detection (measurement in the coherent-state basis) on half of a GKP encoded Bell pair. Noting that a Bell state can be written (ignoring normalization) as $\Sigma_\mu \hat{\sigma}_L^\mu \otimes \hat{\sigma}_L^\mu$. Then, a coherent-state measurement on the first mode with outcome α produces $\Sigma_\mu Tr(|\alpha\rangle\langle\alpha|\sigma_L^\mu)\sigma_L^\mu$ on the second mode, which agrees with Equation (5) using $\hat{\rho}_{in}$ as vacuum and $t=-\sqrt{2}(\text{Re}\alpha, \text{Im}\alpha)^T$. Intuitively, this is just Knill-type error correction, which involves teleporting the state to be corrected through an encoded Bell pair and reinterpreting vacuum teleportation as heterodyne detection.

Therefore, GKP-Clifford QC and Gaussian QC combine with no additional non-Gaussian resources into fault-tolerant, universal QC. This is because |vac> is a distillable magic state that elevates GKP Clifford QC to fault-tolerant universality. Practically, this means there is no longer any need for the pursuit of creating cubic phase states if GKP encoding is used. By focusing on making high-quality GKP $|0_L\rangle$ states, the rest is all Gaussian.

Fundamentally, this shows that two efficiently simulable subtheories, when used together, are universal and fault tolerant. This is straightforward for qubits: just combine Clifford QC based on different Pauli frames. For example, $\{\hat{X}, \hat{Y}, \hat{Z}\}$ and $\{\hat{H}, \hat{Y}, \hat{Z}\hat{Z}\}$ since stabilizer states of one are magic states for the other. The invention demonstrates the "magic" of error correction by deploying it in a nonstandard way to produce resource states from a known, easy-to-prepare state. The "wilderness space" outside a bosonic code's logical subspace may be rich in other resources, too, for example, providing the means to produce other logical states or perform logical operations more easily than would be possible by restricting to the logical subspace. It is contemplated that the invention is likely to extend beyond GKP to other bosonic codes such as rotation-symmetric codes, experimentally proven cat codes, and multi-mode GKP codes.

While the disclosure is susceptible to various modifications and alternative forms, specific exemplary embodiments of the invention have been shown by way of example in the drawings and have been described in detail. It should be understood, however, that there is no intent to limit the disclosure to the particular embodiments disclosed, but on the contrary, the intention is to cover all modifications, equivalents, and alternatives falling within the scope of the disclosure as defined by the appended claims.

The invention claimed is:

1. A method of producing a magic state for a quantum computer, the method comprising steps of:
   providing a Gaussian quantum computer including a circuit;
   generating a Gaussian input state of the circuit;
   applying a bosonic error correction code to the Gaussian input state, wherein the bosonic error correction code is a Gottesman-Kitaev-Preskill (GKP) error correction code consisting of Gaussian operations and a GKP Pauli eigenstate, the GKP error correction code requiring no non-Gaussian resources beyond the GKP Pauli eigenstate and requiring no additional external qubits, and
   producing the magic state.

2. The method of claim 1, wherein the Gaussian input state is a thermal state.

3. The method of claim 1, wherein the Gaussian input state is a vacuum state.

4. The method of claim 1, wherein the magic state produced is used with fault tolerant quantum computing.

5. The method of claim 1, wherein the magic state is a H-type magic state.

6. The method of claim 1, wherein the magic state is a T-type magic state.

7. A method for producing a magic state for a quantum computer, the method comprising steps of:
   providing a Gaussian quantum computer including a circuit;
   generating a Gaussian input state of the circuit;
   applying a Gottesman-Kitaev-Preskill (GKP) error correction code to the Gaussian input state, wherein the GKP error correction code comprises both a non-Gaussian state and a Gaussian operation, the GKP error correction code requiring no non-Gaussian resources beyond a GKP Pauli eigenstate and requiring no additional external qubits; and
   producing the magic state.

8. The method of claim 7, wherein the non-Gaussian state is a GKP logical-0 state.

9. The method of claim 7, wherein the Gaussian input state is a thermal state or a vacuum state.

10. The method of claim 7, wherein the magic state produced is used with fault tolerant quantum computing.

11. The method of claim 7, wherein the magic state is a H-type magic state or a T-type magic state.

12. The method of claim 1, wherein the GKP Pauli eigenstate is a logical-0 state.

13. The method of claim 7, wherein the non-Gaussian state is a GKP Pauli eigenstate.

\* \* \* \* \*